(12) United States Patent
Minzoni

(10) Patent No.: US 10,665,317 B2
(45) Date of Patent: May 26, 2020

(54) METHOD OF ECC ENCODING A DRAM AND A DRAM

(71) Applicant: XI'AN UNIIC SEMICONDUCTORS CO., LTD., Xi'an, Shaanxi (CN)

(72) Inventor: Alessandro Minzoni, Xi'an Shaanxi (CN)

(73) Assignee: XI'AN UNIIC SEMICONDUCTORS CO., LTD., Xi'an, Shaanxi (CN)

( * ) Notice: Subject to any disclaimer, the term of this patent is extended or adjusted under 35 U.S.C. 154(b) by 105 days.

(21) Appl. No.: 15/982,097

(22) Filed: May 17, 2018

(65) Prior Publication Data

US 2018/0336959 A1 Nov. 22, 2018

(30) Foreign Application Priority Data

May 17, 2017 (CN) .......................... 2017 1 0349017

(51) Int. Cl.

| | | |
|---|---|---|
| *G11C 29/00* | (2006.01) | |
| *G11C 29/42* | (2006.01) | |
| *G11C 11/406* | (2006.01) | |
| *G11C 29/52* | (2006.01) | |
| *G06F 11/10* | (2006.01) | |
| *G11C 29/02* | (2006.01) | |
| *G11C 11/4091* | (2006.01) | |
| *G11C 29/04* | (2006.01) | |

(52) U.S. Cl.
CPC .......... *G11C 29/42* (2013.01); *G06F 11/1048* (2013.01); *G11C 11/406* (2013.01); *G11C 29/028* (2013.01); *G11C 29/52* (2013.01); *G11C 11/4091* (2013.01); *G11C 2029/0411* (2013.01); *G11C 2211/4062* (2013.01); *G11C 2211/4063* (2013.01)

(58) Field of Classification Search
None
See application file for complete search history.

(56) References Cited

U.S. PATENT DOCUMENTS

| | | | | |
|---|---|---|---|---|
| 2003/0191888 A1* | 10/2003 | Klein | ..................... | G06F 1/3225 711/105 |
| 2005/0286330 A1* | 12/2005 | Ito | .......................... | G11C 11/406 365/222 |
| 2008/0109705 A1* | 5/2008 | Pawlowski | .......... | G06F 11/1044 714/767 |
| 2008/0222483 A1* | 9/2008 | Ito | .......................... | G06F 11/106 714/754 |
| 2017/0123904 A1* | 5/2017 | Park | .................... | G06F 11/1068 |

OTHER PUBLICATIONS

M. Wajid and S. SB, "Architecture for Faster RAM Controller Design with Inbuilt Memory," 2010 2nd International Conference on Computational Intelligence, Communication Systems and Networks, Liverpool, 2010, pp. 147-151. (Year: 2010).*

* cited by examiner

*Primary Examiner* — Daniel F. McMahon
(74) *Attorney, Agent, or Firm* — Leydig, Voit & Mayer, Ltd.

(57) ABSTRACT

A method of ECC encoding a DRAM and a DRAM thereof. The method comprises determining whether to encode the data according to the value of a flag bit while the DRAM is being refreshed. The ECC encoding module encodes data only if of the flag bit setting and detecting module generates an enable signal. As a result, the length of the valid data for ECC encoding can be guaranteed to comply with the requirements of ECC encoding.

24 Claims, 5 Drawing Sheets

METHOD OF ECC ENCODING A DRAM AND A DRAM

CROSS-REFERENCE TO RELATED APPLICATIONS

This application claims priority under 35 USC 119(a) to Chinese Application No. 201710349017.1, filed May 17, 2017, which is hereby incorporated by reference in its entirety.

TECHNICAL FIELD

The present invention relates to the field of memory, and in particular to DRAM, and more particularly to a method of ECC encoding a DRAM and a DRAM.

BACKGROUND OF THE INVENTION

DRAM (Dynamic Random Access Memory) is a volatile memory.

As for DRAM, data errors often occur during data storage, and thus there is a need for error detection and correction techniques to ensure the correctness of data storage. ECC (Error Correction Code) detects and corrects the erroneous data by adding parity bits to a certain length of data bits. The conventional read and write processes of a DRAM including ECC function are shown in FIG. 1 and FIG. 2 respectively.

FIG. 1 schematically depicts a data write process of a DRAM, in which a data array is used to store data and an ECC array is used to store ECC bits, i.e. parity bits. When an N-bit data is written into a memory from an external source, the N-bit data is used by the memory to generate M-bit parity bits through an ECC encoding circuit. The N-bit data and the M-bit parity bits are temporarily latched, and then written into respective memory arrays by means of write drivers, i.e. the N-bit data is stored in the data array and the M-bit parity bits are stored in the ECC array. The length N of the data is greater than 0 and less than or equal to the length of the data that can be read or written by the memory when the memory performs one read or write operation. The length M of the parity bits is greater than 0 and its value is determined by the selected ECC algorithm. It should be noted that the data array, the ECC array and the ECC encoding circuit are all inside the memory, and the memory may also include other components which are not shown here.

FIG. 2 schematically depicts a data read process of the DRAM. The N-bit data and the M-bit parity bits are read from their respective memory arrays, and temporarily latched after being amplified by the second sense amplifier, and then sent to an ECC error correcting module. The ECC error correcting module can detect and correct errors and output a corrected N-bit data.

It can be known from the data write process shown in FIG. 1 that when the ECC encoding module generates the M-bit parity bits, data bits of length N are required, which is determined by the selected ECC algorithm. However, as for a memory, not all of the input N bits can be used for ECC encoding, that is, the length of the data valid for encoding in the input data is not constant, wherein the data valid for encoding refers to the data that can be used to generate parity bits. For example, the specification of DRAM states that when there is a data-mask or a burst chop mode, several bits in an N-bit input data cannot be used for ECC encoding, and the data length of the data valid for encoding may change, resulting in the data length being less than N. For another example, for structures of different data lengths, such as X4, X8 or X16 mode, etc., the length of the data valid for encoding also changes with external control, resulting in the data length of data valid for encoding being not equal to N. However, once the ECC algorithm has been selected, the data length required by the corresponding ECC encoding module is constant, and thus the ECC bit cannot be successfully generated in the case where the data length of the data valid for encoding changes.

One solution in the prior art is to find a minimum data length within all the constraints that may be encountered, and select an ECC algorithm based on this minimum data length so that all modes can be supported. If the minimum data length is 8, even for the most efficient Hamming code, at least 4 bits of parity bits are required, which increases the memory area by at least 50% so as to store the parity bits of the ECC, resulting in a significant increase in the cost of the memory and a reduction in the flexibility and efficiency of ECC algorithm selection.

If the power consumption of the write operation is not increased, or the timing of the write operation is not affected, or for any other reason the ECC encoding cannot be performed during write operation, the ECC function cannot be realized by the conventional method.

Therefore, there is a need for a new ECC encoding method to solve the above problems.

SUMMARY OF THE INVENTION

According to a first aspect of the present invention, a method of ECC encoding a DRAM is provided, wherein the DRAM comprises a memory array, the method comprising:

while the DRAM is being refreshed, a flag bit setting and detecting module detects whether a flag bit in a flag bit array is an initial value, wherein the flag bit array is in the memory array, and the flag bit setting and detecting module is in the DRAM, and wherein the flag bit is in a one-to-one correspondence with each data of length N in a data array in the memory array;

if the flag bit setting and detecting module detects that the flag bit is the initial value, indicating that the N-bit data corresponding to the flag bit has not been encoded by ECC, the flag bit setting and detecting module generates an enable signal, which causes an ECC encoding module in the DRAM to encode the N-bit data and generate corresponding parity bits, and the flag bit setting and detecting module sets the flag bit to a non-initial value; and if the flag bit setting and detecting module detects that the flag bit is a non-initial value, indicating that the N-bit data corresponding to the flag bit has been encoded by ECC, the flag bit setting and detecting module performs no operation;

wherein the ECC encoding module encodes data only if the flag bit setting and detecting module generates the enable signal.

The advantage of the above method is that the length of the valid data for ECC encoding can be guaranteed to comply with the requirements of ECC encoding, because the word lines are activated during refresh, and at this point the data in the memory cells is read out and amplified. Each time the data of length N is selected, which can be used for ECC encoding, thus ensuring that the data of valid data length N is used for ECC encoding, thereby ensuring the correctness of ECC encoding.

According to a preferred embodiment of the method of the present invention, during a refresh, all the word lines of the DRAM are activated sequentially and the data under the same word line is refreshed simultaneously, and wherein only a part of the data under each word line is encoded by ECC during each refresh.

According to a preferred embodiment of the method of the present invention, during the refreshes performed immediately after the DRAM is powered-up, for each refresh, each word line has the same number of column addresses for ECC encoding.

According to a preferred embodiment of the method of the present invention, after all data in the data array has been encoded by ECC once since the powered-up of the DRAM, for each refresh, each word line has a different number of column addresses for ECC encoding.

According to a preferred embodiment of the method of the present invention, after the DRAM is powered-up and before the first refresh, all the flag bits in the flag bit array are set to the initial value.

According to a preferred embodiment of the method of the present invention, when data is written into the DRAM from an external data source, the flag bit setting and detecting module changes the flag bit corresponding to the written data to the initial value.

According to a preferred embodiment of the method of the present invention, the refresh comprises Refresh and Self Refresh.

According to a preferred embodiment of the method of the present invention, the initial value is 0 and the non-initial value is 1.

According to a preferred embodiment of the method of the present invention, the initial value is 1 and the non-initial value is 0.

According to a preferred embodiment of the method of the present invention, the detection performed by the flag bit setting and detecting module of whether the flag bit is the initial value is performed sequentially according to the column addresses for each word line.

According to a preferred embodiment of the method of the present invention, the method further comprises the step of correcting error in a data unit, comprising:

the flag bit setting and detecting module detects the state of the flag bit corresponding to the data and generates a decoding enable signal, if the value of the flag bit is the initial value, the decoding enable signal disenables the ECC correction function, if the value of the flag bit is the non-initial value, the decode enable signal enables the ECC error correction function.

According to a second aspect of the present invention, a DRAM is provided, the DRAM comprising a memory array, wherein the DRAM further comprises:

a flag bit array; and a flag bit setting and detecting module, which detects whether a flag bit in a flag bit array is an initial value, wherein the flag bit array is in the memory array, and the flag bit setting and detecting module is in the DRAM, and wherein the flag bit is in a one-to-one correspondence with each data of length N in a data array in the memory array;

if the flag bit setting and detecting module detects that the flag bit is the initial value, indicating that the N-bit data corresponding to the flag bit has not been encoded by ECC, the flag bit setting and detecting module generates an enable signal, which causes an ECC encoding module in the DRAM to encode the N-bit data and generate corresponding parity bits, and the flag bit setting and detecting module sets the flag bit to a non-initial value; and if the flag bit setting and detecting module detects that the flag bit is a non-initial value, indicating that the N-bit data corresponding to the flag bit has been encoded by ECC, the flag bit setting and detecting module performs no operation;

wherein the ECC encoding module encodes data only if the flag bit setting and detecting module generates the enable signal.

According to a preferred embodiment of the DRAM of the present invention, during a refresh, all the word lines of the DRAM are activated sequentially and the data under the same word line is refreshed simultaneously, and wherein only a part of the data under each word line is encoded by ECC during each refresh.

According to a preferred embodiment of the DRAM of the present invention, during the refreshes performed immediately after the DRAM is powered-up, for each refresh, each word line has the same number of column addresses for ECC encoding.

According to a preferred embodiment of the DRAM of the present invention, after all data in the data array has been encoded by ECC once since the powered-up of the DRAM, for each refresh, each word line has a different number of column addresses for ECC encoding.

According to a preferred embodiment of the DRAM of the present invention, after the DRAM is powered-up and before the first refresh, all the flag bits in the flag bit array are set to the initial value.

According to a preferred embodiment of the DRAM of the present invention, when data is written into the DRAM from an external data source, the flag bit setting and detecting module changes the flag bit corresponding to the written data to the initial value.

According to a preferred embodiment of the DRAM of the present invention, the refresh comprises Refresh and Self Refresh.

According to a preferred embodiment of the DRAM of the present invention, the initial value is 0 and the non-initial value is 1.

According to a preferred embodiment of the DRAM of the present invention, the initial value is 1 and the non-initial value is 0.

According to a preferred embodiment of the DRAM of the present invention, the detection performed by the flag bit setting and detecting module of whether the flag bit is the initial value is performed sequentially according to the column addresses for each word line.

According to a preferred embodiment of the DRAM of the present invention, when an ECC error correction is performed in the DRAM, the flag bit setting and detecting module detects the state of the flag bit corresponding to the data and generates a decoding enable signal, which disenables the ECC error correction function if the value of the flag bit is the initial value, and enables the ECC error correction function if the value of the flag bit is the non-initial value.

DETAILED DESCRIPTION OF THE INVENTION

Figure 1:
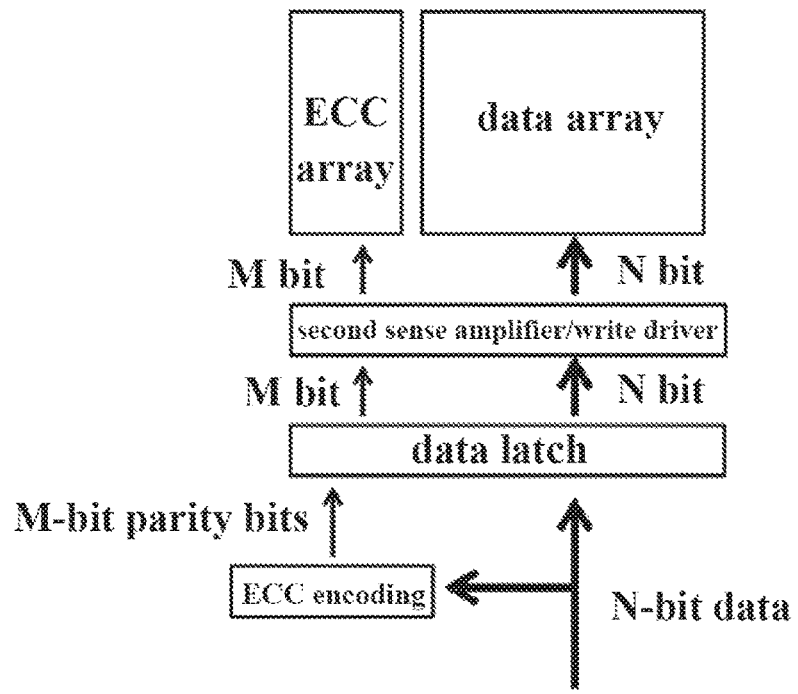
FIG. 1 schematically depicts a write process of a DRAM.

Various examples of the present invention will be further described below with reference to the accompanying drawings. Throughout the accompanying drawings, the same or similar reference numerals denote the same or similar elements or elements having the same or similar functions. It should be understood that the embodiments described below with reference to the accompanying drawings are only exemplary, being intended to explain rather than limit the present invention.

Figure 2:
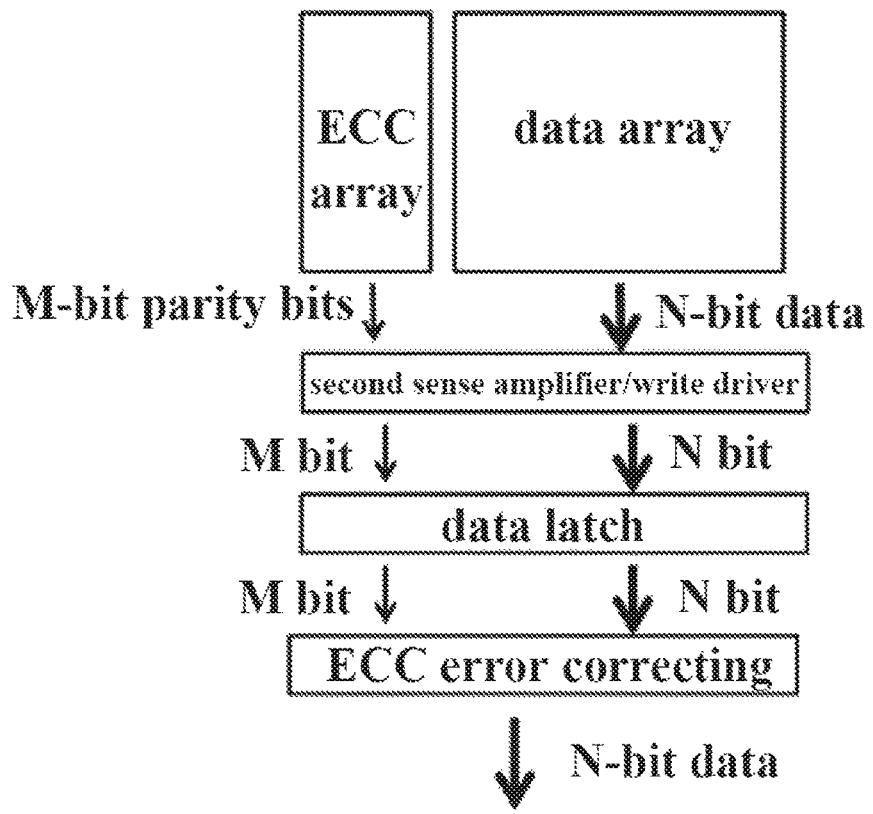
FIG. 2 schematically depicts a read process of the DRAM.

As for DRAM, since information stored in a memory cell (a plurality of memory cells constitute a memory array including a data array and an ECC array) may be lost, the stored information in the memory cell needs to be refreshed within a certain time. When a refresh operation is performed, the word lines are activated sequentially, and the contents of all the memory cells under the same word line are read out simultaneously, and amplified, and then written back, so as to prevent the information from being lost. It should be understood that reading out and writing back respectively refers to the reading and writing performed by the memory itself during a refresh, while it is described in FIGS. 1 and 2, respectively, that a data is written into the memory from an external source and a data is read from the memory to the external. Specifically, in a refresh operation, the data of each of memory cells under each word line is read out, and amplified and latched by the first sense amplifier, and then the data is written back to the memory cell. The first sense amplifier for refresh operation described here is within each memory array and can also be used to latch data when the DRAM is activated. The second sense amplifier described above is outside of the memory array but within the DRAM.

The inventor of the present invention has innovatively conceived of solving the problems mentioned in the background art given the fact that data is read out during a refresh.

The idea of the present invention is to utilize the fact that during a refresh, data needs to be read out and written back for ECC encoding. Such operation has the advantage that the length of the valid data for ECC encoding can be guaranteed to meet the requirements of ECC encoding, because the word lines are activated during a refresh, and the data in the memory cells is read out and amplified. Each time the data of length N is selected, which can be used for ECC encoding, thus ensuring that the data of valid data length N is used for ECC encoding, thereby ensuring the correctness of ECC encoding.

The refresh operation of DRAM includes an automatic refresh operation (Refresh), a self refresh operation (Self Refresh), and the like. These different refresh operations are only slightly different in control. The present invention is applicable to the above-listed and other unlisted refresh operations.

According to a preferred embodiment of the present invention, a flag bit array and a flag bit setting and detecting module are provided in a memory, wherein the flag bit array is located in a memory array of the memory. The operation principles of the flag bit array and flag bit setting and detecting module will be described below with reference to FIG. 3.

Figure 3:
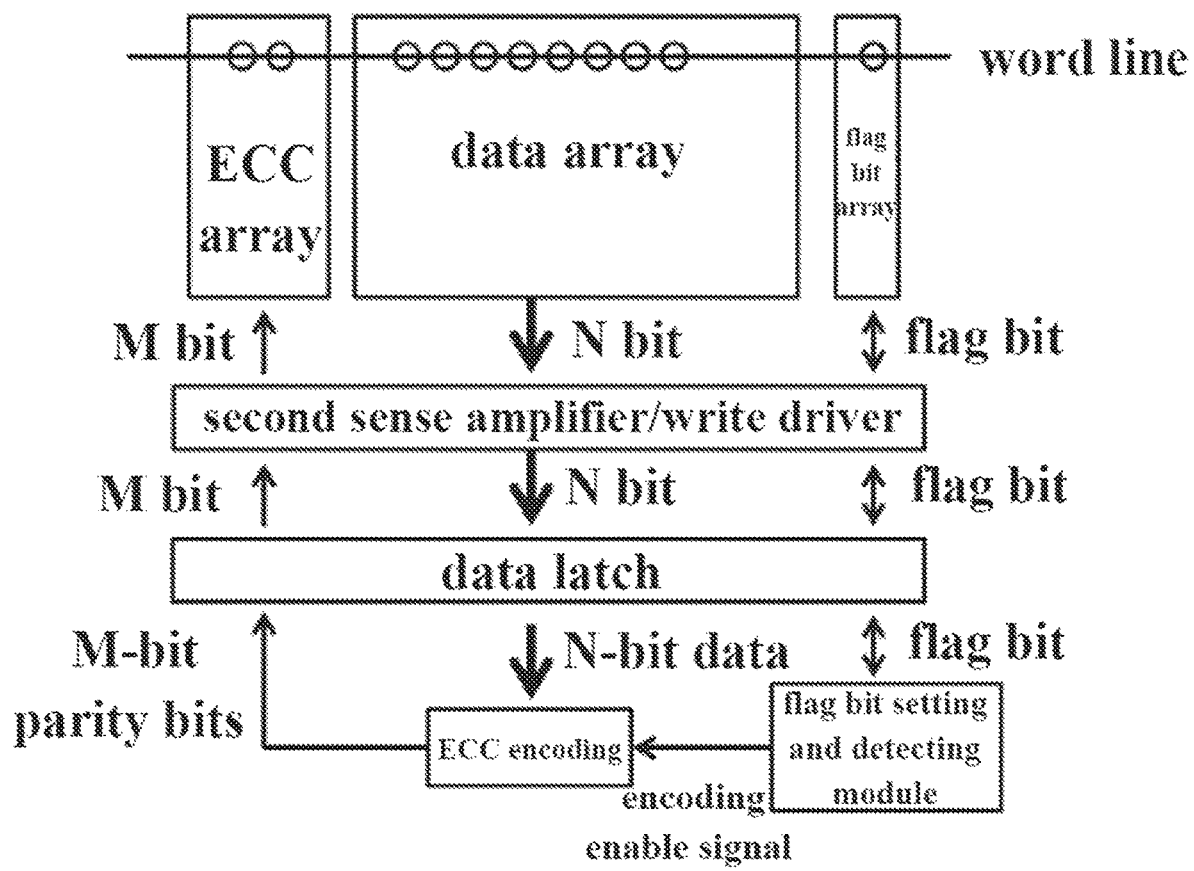
FIG. 3 shows a memory with a flag bit array and a flag bit setting and detecting module.

FIG. 3 shows a DRAM with a flag bit array and a flag bit setting and detecting module. As shown in FIG. 3, the DRAM is introduced with a flag bit array and a flag bit setting and detecting module, compared with the DRAMs shown in FIGS. 1 and 2. A flag bit is stored in the flag bit array. For each data of data length N in the data array, there is a corresponding flag bit in the flag bit array. The data length N is the required data length set by the ECC algorithm.

The flag bit is used to indicate whether the data corresponding thereto has been encoded by ECC. During a refresh, if the flag bit indicates that ECC encoding has been performed, the corresponding data does not need to be encoded by ECC; if the flag bit indicates that ECC encoding has not been performed, the ECC encoder performs ECC encoding operation on the N-bit data corresponding to the flag bit, and then the generated ECC parity bits are stored into the ECC array. The flag bit have an initial value, which indicates that the corresponding data has not been subjected to an ECC encoding operation. When the corresponding data has subjected to an ECC encoding operation, the flag bit setting and detecting module change the value of the flag bit accordingly to a non-initial value. However, when there is any data change caused by writing an external data into the memory array, a new ECC encoding is required, and the corresponding flag bit will be reset to the initial value.

One word line is shown in FIG. 3; however, it should be understood that this is merely illustrative and there are several word lines in the memory. Taking one word line as an example, during a refresh, data in all memory cells under the word line is read out, amplified by the first sense amplifier (not shown), and then latched in a data latch. When the flag bit indicates that the data corresponding thereto has not been encoded by ECC, the data latched in the first sense amplifier is sent to the ECC encoder via the second sense amplifier and the data latch, and the flag bit setting and detecting module enables the ECC encoder so that the ECC encoder produces corresponding parity bits and sends the parity bits to the ECC array for storage.

As described above, after the data has been subjected to the ECC encoding operation, the flag bit setting and detecting module change the value of the corresponding flag bit. When there is any data change caused by writing an external data into the memory array, a new ECC encoding is required, and the corresponding flag bit will be reset to the initial value. Resetting the flag bit is operated by the flag bit setting and detecting module. The interaction between the flag bit setting and detecting module and the second sense amplifier/write driver and data latch is similar to the data writing and data reading described in FIGS. 1 and 2, and will not be described here.

Embodiments of the present invention are specifically described below with reference to FIGS. 4a-4b and 5.

Figure 4A:
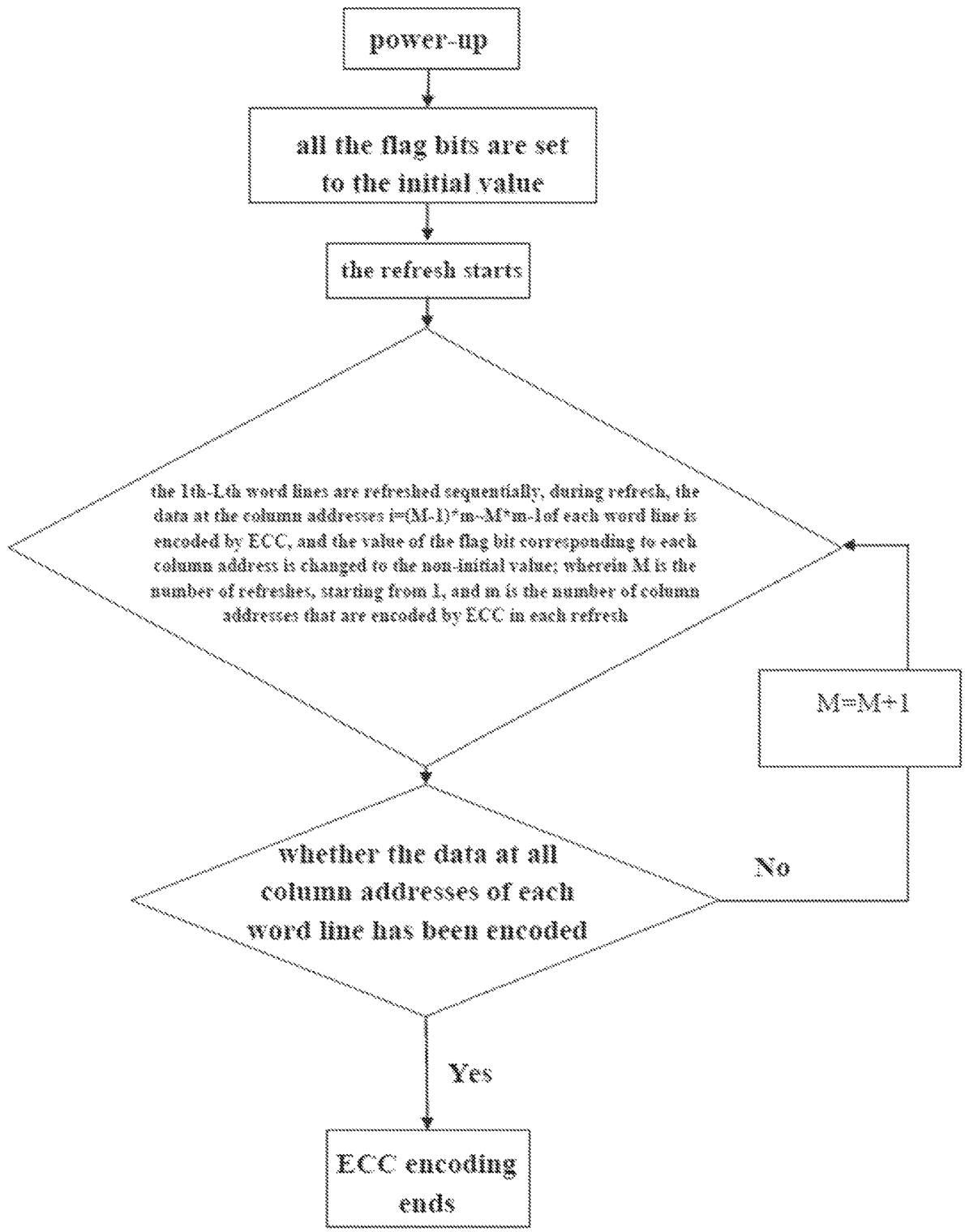
FIG. 4a shows a flowchart of the ECC encoding operation during the refresh performed immediately after power-up, in the memory with a flag bit array and a flag bit setting and detecting module.

FIG. 4a shows a flowchart of the ECC encoding operation during the refresh performed immediately after power-up, in the memory with a flag bit array and a flag bit setting and detecting module.

Since the DRAM is just powered up, all the data in it is newly written. First of all, the flag bit is initialized to a certain value after power-up. For example, the initial value is '0', indicating that the data corresponding to the flag bit has not been encoded by ECC, and all flag bits are initial values. However, it should be understood that the initial value being '0' is only illustrative, and the initial value of the flag bit in the present invention is not limited to '0'. Power-up refers to the process of starting DRAM. Once the DRAM is powered-off, the DRAM needs to be rewritten after being powered-up again.

When the refresh operation is performed, L word lines are activated sequentially, and the data in the memory arrays under the same word line is refreshed simultaneously. It should be understood that because of the limited time for each refresh, not all data under each word line can be encoded by ECC in one refresh. In order to encode all data under the word line at least once, multiple refreshes need to be performed. For example, in the first refresh, the data at the first to eighth column addresses of each word line is encoded by ECC, and in the second refresh, the data at the ninth to sixteenth column addresses of the each word line is encoded by ECC, and so on. It should be understood that for a refresh operation, when one word line is refreshed, the data in each of the memory cells under the word line is refreshed simultaneously. It takes a certain time T to refresh one word line, after time T, the next word line can be refreshed, and so on. That is to say, each word line is refreshed sequentially. The first refresh here referred to means that all word lines are refreshed once, and the second refresh means that all word lines are refreshed again after the first refresh. The number m of column addresses that are encoded by ECC in each refresh is not necessarily eight, and other numbers are also feasible.

The memory arrays under each word line are refreshed, i.e. the data is read out and amplified, and then latched in the first sense amplifier. It should be understood that although the data under the same word line is refreshed simultaneously, in the present invention, the determination, performed by the flag bit setting and detecting module, of whether the ECC encoding needs to be performed is sequentially performed for the column addresses under each word line, i.e. a determination is made sequentially for each N-bit data.

When determining the column address i of the word line k (i.e. the row address k), the flag bit setting and detecting module detects that the value of the flag bit corresponding to this address is an initial value, such as '0', indicating that the N-bit data stored in column address i has not been encoded by ECC; thus, the N-bit data is sent from the first sense amplifier to the second sense amplifier and then sent to the ECC encoder via the data latch, and the encoding enable signal enables the ECC encoder to produce M-bit ECC parity bits for the data, which parity bits will be written into the ECC array. At the same time, the value of the flag bit for address i is rewritten, for example, rewritten from '0' to '1'.

As shown in FIG. 4a, the refresh begins with the first word line and proceeds sequentially to the Lth word line. In the first refresh, the data at the column addresses i=0 to i=m−1 of each word line is encoded by ECC, and in the second refresh, the data at the column addresses i=m to i=2m−1 of each word line is encoded by ECC, and so on, until the data at all column addresses is encoded.

After the DRAM memory is powered-up, all the flag bits in the flag bit array are the initial value before the first refresh, indicating that the data of all the addresses under the word line has not been encoded by ECC. However, after all the data in the DRAM has been encoded after the first power-up, the value of each flag bit is a non-initial value, such as '1'. However, since new data is often written into the DRAM, the data change in the memory array in the DRAM will cause the respective flag bit to be reset to the initial value, such as '0'.

Figure 4B:
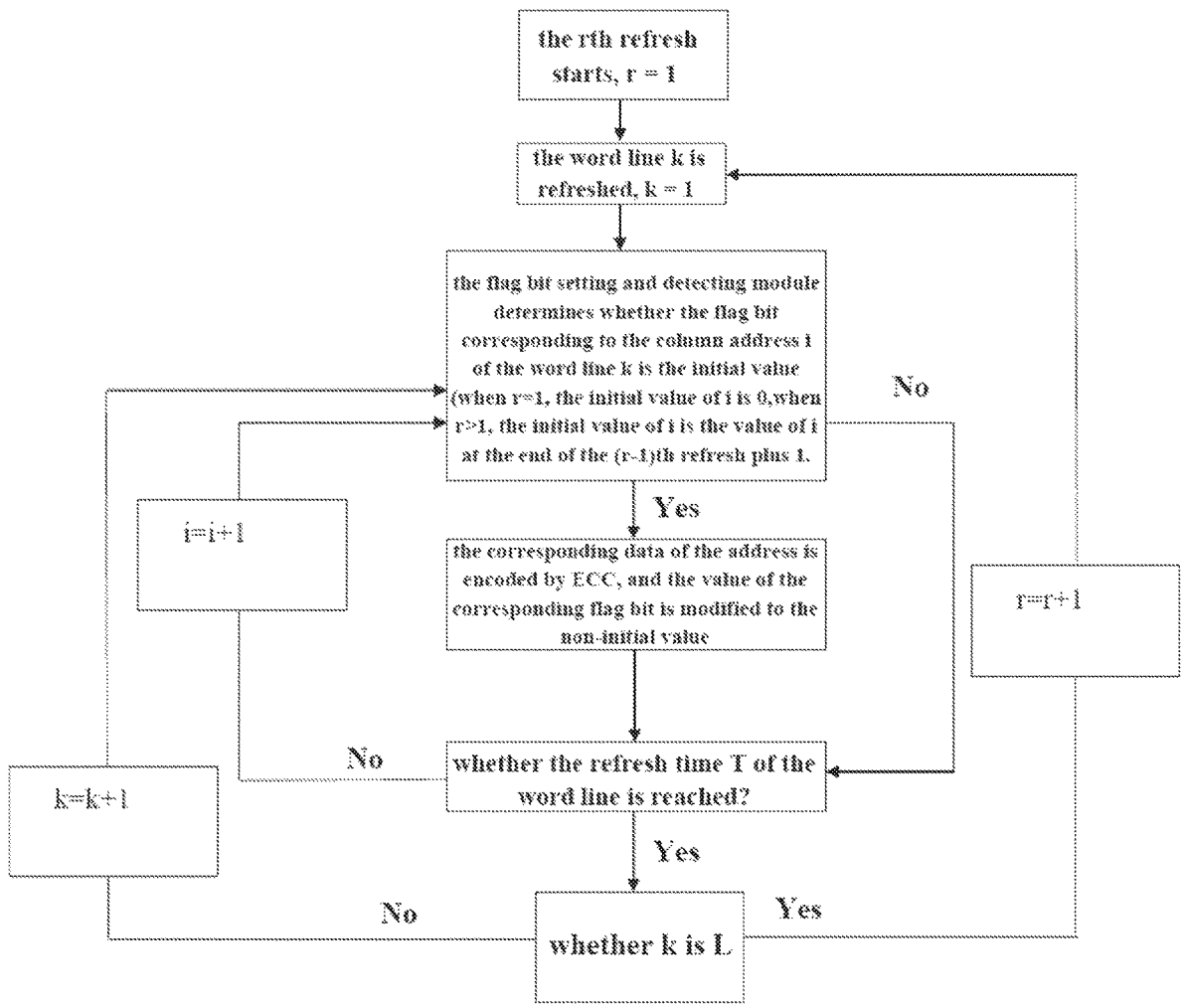
FIG. 4b shows a flowchart of the ECC encoding operation during the refresh performed after all data in the DRAM has been encoded by ECC since power-up.

FIG. 4b shows a flowchart of the ECC encoding operation during the refresh, which is performed after all data in the DRAM has been encoded by ECC after power-up. When the refresh number r=1, the first word line (k=1) is refreshed first, and the initial value at column address i is '0'. The flag bit setting and detecting module detects whether the value of the flag bit corresponding to address i is the initial value. If the value of the flag bit corresponding to address i is the initial value, then the corresponding data is encoded by ECC, and the flag bit is rewritten into a non-initial value. If the value of the flag bit corresponding to address i is the non-initial value, then it is judged whether the time remaining in this refresh of this word line is sufficient to perform the determination and encoding on the next column address, that is, whether the determination and encoding of the next column address can be finished before the time T for refreshing a word line ends. If it can be done, the flag bit setting and detecting module detects whether the value of the flag bit corresponding to address i+1 is the initial value; otherwise the refresh of this word line is completed, and the refresh continues until the Lth word line is refreshed. Then the next (r+1)th refresh is performed. It should be noted that, since not all column addresses under each word line need to be encoded by ECC and refresh time for each word line is the same, for each refresh, each word line has a different number of column addresses for ECC encoding during a refresh. For the (r+1)th refresh, the column addresses of each word line which the flag bit setting and detecting module begins to detect are not the same; the initial value of i is correlated with the value of i of the word line at the end of the (r−1)th refresh, i.e., the initial value of i as shown in the figure is the value of i at the end of the (r−1)th refresh plus 1.

It should be understood that, for each word line, it can also be different from that shown in FIG. 4b, that is, for each refresh, each word line has the same number of column addresses for ECC encoding. This has an advantage that the control of encoding becomes simple.

Figure 5:
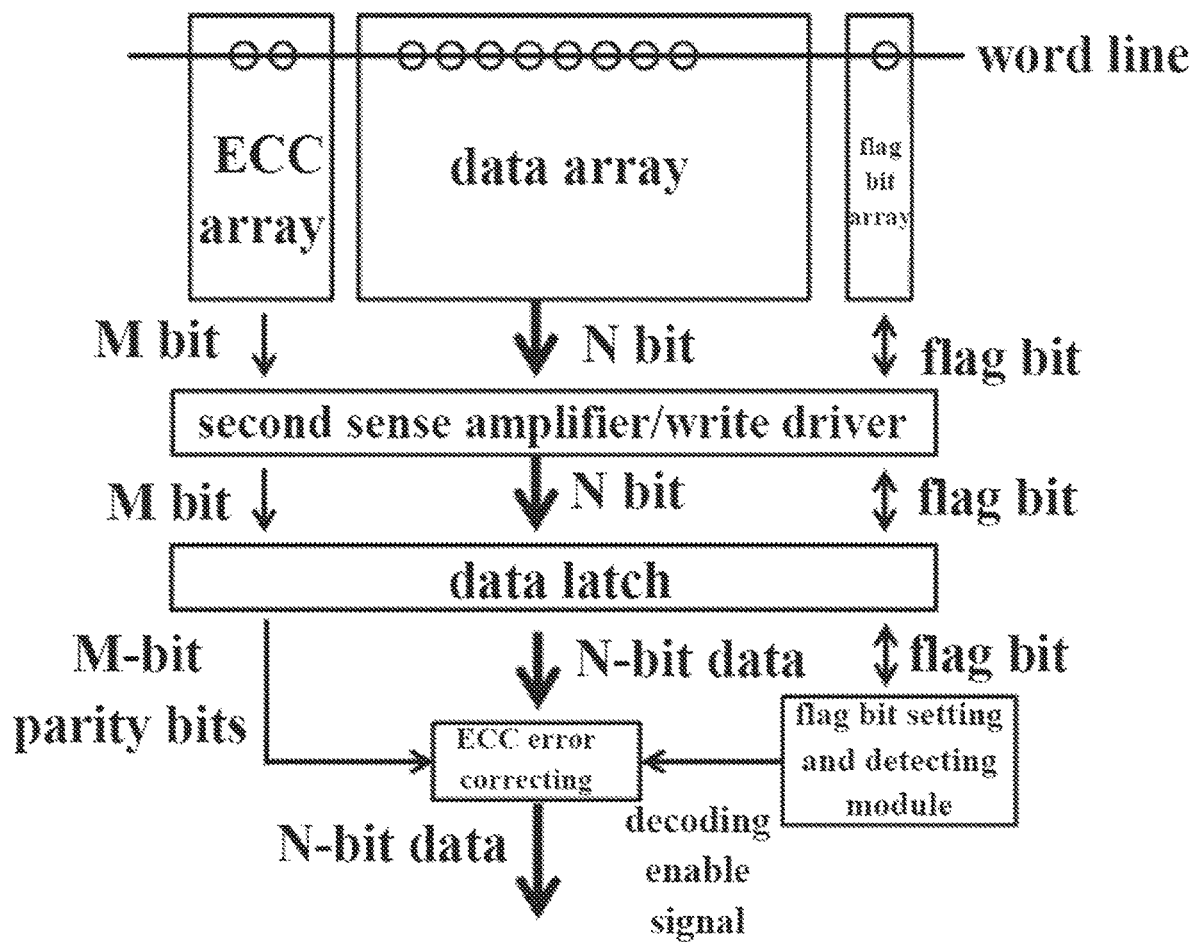
FIG. 5 shows the process of error correcting performed in the memory with a flag bit array and a flag bit setting and detecting module.

FIG. 5 shows the process of error correcting performed in the memory with a flag bit array and a flag bit setting and detecting module.

As shown in FIG. 5, when error correction is performed, firstly, the N-bit data and M-bit parity bits are read from the memory array, and the flag bit setting and detecting module detects the state of the flag bit corresponding to the N-bit data.

If the value of the flag bit is in initial state, such as '0', then the decoding enable signal disenables the ECC error correction function, meaning that the ECC error correction function cannot be used.

If the value of the flag bit is not in initial state, such as '1', then the decoding enable signal enables the ECC error correction function, and data errors can be detected and corrected as the ECC error correction function is normal.

It should be understood that the embodiments and examples herein are for illustrative purposes only and that various modifications and variants may be made by those skilled in the art without departing from the scope defined by the claims.

It should be noted that the above-mentioned embodiments illustrate rather than limit the invention, and that those skilled in the art will be able to design many alternative embodiments. Use of the verb "comprise" and its conjugations does not exclude the presence of elements or steps other than those stated in a claim. The article "a" or "an" preceding an element does not exclude the presence of a plurality of such elements.

The invention claimed is:
1. A method of ECC encoding a DRAM, wherein the DRAM comprises a memory array, the method comprising:

while the DRAM is being refreshed, a flag bit setting and detecting module detects whether a flag bit in a flag bit array is an initial value, wherein the flag bit array is in the memory array, and the flag bit setting and detecting module is in the DRAM, and wherein the flag bit is in a one-to-one correspondence with each data of length N in a data array in the memory array;

if the flag bit setting and detecting module detects that the flag bit is the initial value, indicating that the N-bit data corresponding to the flag bit has not been encoded by ECC, the flag bit setting and detecting module generates an enable signal, which causes an ECC encoding module in the DRAM to encode the N-bit data and generate corresponding parity bits, and the flag bit setting and detecting module sets the flag bit to a non-initial value; and if the flag bit setting and detecting module detects that the flag bit is a non-initial value, indicating that the N-bit data corresponding to the flag bit has been encoded by ECC, the flag bit setting and detecting module performs no operation;

wherein the ECC encoding module encodes the N-bit data only if the flag bit setting and detecting module generates the enable signal;

wherein during a refresh, all word lines of the DRAM are activated sequentially and data under one word line is refreshed simultaneously, and wherein only a part of the data under each word line of the DRAM is encoded by ECC during each refresh.

2. The method of claim 1, wherein during the refreshes performed immediately after the DRAM is powered-up, for each refresh, numbers of column addresses in which data is encoded by ECC in each word line of the DRAM are the same.

3. The method of claim 1, wherein after all of the N-bit data in the data array has been encoded by ECC once since the powered-up of the DRAM, for each refresh, numbers of column addresses in which data is encoded by ECC in each word line of the DRAM are different.

4. The method of claim 1, wherein after the DRAM is powered-up and before a first refresh, all flag bits in the flag bit array are set to the initial value.

5. The method of claim 1, wherein when the N-bit data in the data array is written into the DRAM from an external data source, the flag bit setting and detecting module changes the flag bit corresponding to the written data to the initial value.

6. The method of claim 1, wherein the refresh comprises an automatic refresh and a self-refresh, wherein the automatic refresh and the self-refresh are only different in control mechanism.

7. The method of claim 1, wherein the initial value is 0 and the non-initial value is 1, or the initial value is 1 and the non-initial value is 0.

8. The method of claim 1, wherein the initial value is 1 and the non-initial value is 0, or the initial value is 1 and the non-initial value is 0.

9. The method of claim 1, wherein the detection performed by the flag bit setting and detecting module of whether the flag bit is the initial value is performed sequentially according to column addresses for each word line of the DRAM.

10. The method of claim 1, wherein the detection performed by the flag bit setting and detecting module of whether the flag bit is the initial value is performed sequentially according to the column addresses for each word line of the DRAM.

11. The method of claim 1, wherein the method further comprises the step of correcting error in the data array, comprising:

the flag bit setting and detecting module detects the state of the flag bit corresponding to the N-bit data in the data array and generates a decoding enable signal, if the value of the flag bit is the initial value, the decoding enable signal disenables an ECC correction function, if the value of the flag bit is the non-initial value, the decode enable signal enables the ECC error correction function.

12. The method of claim 1, wherein the method further comprises the step of correcting error in the data array, comprising:

the flag bit setting and detecting module detects the state of the flag bit corresponding to the N-bit data in the data array and generates a decoding enable signal, if the value of the flag bit is the initial value, the decoding enable signal disenables an ECC correction function, if the value of the flag bit is the non-initial value, the decode enable signal enables the ECC error correction function.

13. A DRAM, the DRAM comprising a memory array, wherein the DRAM further comprises:

a flag bit array; and a flag bit setting and detecting module, which detects whether a flag bit in a flag bit array is an initial value, wherein the flag bit array is in the memory array, and the flag bit setting and detecting module is in the DRAM, and wherein the flag bit is in a one-to-one correspondence with each data of length N in a data array in the memory array;

if the flag bit setting and detecting module detects that the flag bit is the initial value, indicating that the N-bit data corresponding to the flag bit has not been encoded by ECC, the flag bit setting and detecting module generates an enable signal, which causes an ECC encoding module in the DRAM to encode the N-bit data and generate corresponding parity bits, and the flag bit setting and detecting module sets the flag bit to a non-initial value; and if the flag bit setting and detecting module detects that the flag bit is a non-initial value, indicating that the N-bit data corresponding to the flag bit has been encoded by ECC, the flag bit setting and detecting module performs no operation;

wherein the ECC encoding module encodes the N-bit data only if the flag bit setting and detecting module generates the enable signal;

wherein during a refresh, all word lines of the DRAM are activated sequentially and data under one word line is refreshed simultaneously, and wherein only a part of the data under each word line of the DRAM is encoded by ECC during each refresh.

14. The DRAM of claim 13, wherein during refreshes performed immediately after the DRAM is powered-up, for each refresh, numbers of column addresses in which data is encoded by ECC in each word line of the DRAM are the same.

15. The DRAM of claim 13, wherein after all of the N-bit data in the data array has been encoded by ECC once since the powered-up of the DRAM, for each refresh, numbers of column addresses in which data is encoded by ECC in each word line of the DRAM are different.

16. The DRAM of claim 13, wherein after the DRAM is powered-up and before a first refresh, all flag bits in the flag bit array are set to the initial value.

17. The DRAM of claim 13, wherein when the N-bit data in the data array is written into the DRAM from an external data source, the flag bit setting and detecting module changes the flag bit corresponding to the written data to the initial value.

18. The DRAM of claim 13, wherein the refresh comprises an automatic refresh and a self-refresh, wherein the automatic refresh and the self-refresh are only different in control mechanism.

19. The DRAM of claim 13, wherein the initial value is 0 and the non-initial value is 1, or the initial value is 1 and the non-initial value is 0.

20. The DRAM of claim 13, wherein the initial value is 0 and the non-initial value is 1, or the initial value is 1 and the non-initial value is 0.

21. The DRAM of claim 13, wherein the detection performed by the flag bit setting and detecting module of whether the flag bit is the initial value is performed sequentially according to the column addresses for each word line of the DRAM.

22. The DRAM of claim 13, wherein the detection performed by the flag bit setting and detecting module of whether the flag bit is the initial value is performed sequentially according to the column addresses for each word line of the DRAM.

23. The DRAM of claim 13, wherein when an ECC error correction is performed in the DRAM, the flag bit setting and detecting module detects the state of the flag bit corresponding to the N-bit data in the data array and generates a decoding enable signal, which disenables an ECC error correction function if the value of the flag bit is the initial value, and enables the ECC error correction function if the value of the flag bit is the non-initial value.

24. The DRAM of claim 13, wherein when an ECC error correction is performed in the DRAM, the flag bit setting and detecting module detects the state of the flag bit corresponding to the N-bit data in the data array and generates a decoding enable signal, which disenables an ECC error correction function if the value of the flag bit is the initial value, and enables the ECC error correction function if the value of the flag bit is the non-initial value.

* * * * *

UNITED STATES PATENT AND TRADEMARK OFFICE
CERTIFICATE OF CORRECTION

PATENT NO. : 10,665,317 B2
APPLICATION NO. : 15/982097
DATED : May 26, 2020
INVENTOR(S) : Minzoni Page 1 of 1

It is certified that error appears in the above-identified patent and that said Letters Patent is hereby corrected as shown below:

In the Claims

In Claim 2, Column 9, Line 30, please delete "the refreshes" and replace with --refreshes--.

In Claim 3, Column 9, Line 37, please delete "the powered-up" and replace with --powered-up--.

In Claim 5, Column 9, Line 46, please delete "the written data" and replace with --written data--.

In Claim 10, Column 9, Line 66, please delete "the column" and replace with --column--.

In Claim 15, Column 10, Line 62, please delete "the powered-up" and replace with --powered-up--.

In Claim 17, Column 11, Line 4, please delete "the written data" and replace with --written data--.

In Claim 21, Column 11, Line 19, please delete "the column" and replace with --column--.

In Claim 22, Column 12, Line 2, please delete "the column" and replace with --column--.

Signed and Sealed this
Sixth Day of October, 2020

Andrei Iancu
*Director of the United States Patent and Trademark Office*